United States Patent
Sakamoto

(10) Patent No.: US 11,133,779 B2
(45) Date of Patent: Sep. 28, 2021

(54) CRYSTAL OSCILLATOR

(71) Applicant: NIHON DEMPA KOGYO CO., LTD., Tokyo (JP)

(72) Inventor: Katsuaki Sakamoto, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 0 days.

(21) Appl. No.: 17/160,394

(22) Filed: Jan. 28, 2021

(65) Prior Publication Data

US 2021/0242833 A1  Aug. 5, 2021

(30) Foreign Application Priority Data

Jan. 31, 2020 (JP) .............................. JP2020-014955

(51) Int. Cl.
*H03B 5/12* (2006.01)
*H03B 5/36* (2006.01)

(52) U.S. Cl.
CPC .............. *H03B 5/1231* (2013.01); *H03B 5/36* (2013.01); *H03B 2200/0004* (2013.01); *H03B 2200/0008* (2013.01); *H03B 2200/009* (2013.01)

(58) Field of Classification Search
CPC ............................... H03B 5/1231; H03B 5/36; H03B 2200/0004; H03B 2200/009; H03B 2200/0008

USPC ................................ 331/158, 116 FE, 76, 77
See application file for complete search history.

(56) References Cited

U.S. PATENT DOCUMENTS

| 8,830,004 B2* | 9/2014 | Koyama | H03H 3/02 331/66 |
| 2002/0017959 A1* | 2/2002 | Kanazawa | H03B 5/368 331/76 |
| 2007/0030083 A1* | 2/2007 | Hashimoto | H03L 1/022 331/158 |
| 2014/0125422 A1* | 5/2014 | Koyama | H03B 5/326 331/116 R |

FOREIGN PATENT DOCUMENTS

JP            2002232236        8/2002

* cited by examiner

*Primary Examiner* — Arnold M Kinkead
(74) *Attorney, Agent, or Firm* — JCIPRNET

(57) ABSTRACT

An ultra-low noise crystal oscillator uses two crystal unit; an oscillation element of an oscillation circuit section and a crystal filter of a subsequent filter section. A Butler circuit in which the capacitors (C1, C2) and the inductor (L) connected in series is connected in parallel to the oscillator circuit section. This is the crystal oscillator that simplifies the manufacturing process, improves the manufacturing quality, and has good floor noise characteristics.

2 Claims, 3 Drawing Sheets

CRYSTAL OSCILLATOR

CROSS-REFERENCE TO RELATED APPLICATIONS

This application claims the priority benefit of Japanese Patent Application No. 2020-014955, filed on Jan. 31, 2020. The entirety of the above-mentioned patent application is hereby incorporated by reference herein and made a part of this specification.

TECHNICAL FIELD

The disclosure relates to an ultra-low noise crystal oscillator using two crystal units, and more particularly, to a crystal oscillator capable of improving the manufacturing quality by simplifying the manufacturing process and improving the floor noise characteristics.

DESCRIPTION OF THE RELATED ART

[Description of Prior Arts]

In conventional crystal oscillators, there is a crystal oscillator with ultra-low noise using two crystal units; an oscillation element in the oscillator circuit section and a crystal filter in the filter section at the subsequent stage.

[The Ultra-Low Noise Crystal Oscillator: FIG. 3]

An ultra-low noise crystal oscillator will be described with reference to FIG. 3. FIG. 3 is a simplified circuit diagram of an ultra-low noise crystal oscillator.

The ultra-low noise crystal oscillator is composed of an oscillation circuit section and a filter section at the subsequent stage, as shown in FIG. 3.

The oscillator circuit section is composed of an amplifier (Amp) 1 and an oscillation element (X1) 4. Then, Amp1 and the amplifier (Amp) 2 in a filter section of the subsequent stage are connected in series, and Amp1 and the oscillation element 4 are connected in parallel.

The oscillation element 4 is a crystal unit and oscillates at a specific frequency.

Amp1 amplifies the oscillation frequency of the oscillation element 4.

The filter section of the subsequent stage is composed of an amplifier (Amp) 2, a crystal filter (X2) 5, and an amplifier (Amp) 3. Then, one end of the crystal filter 5 is connected to the output of Amp2. The other end of the crystal filter 5 is connected to the input of Amp3.

Amp2 amplifies the output from Amp1 and outputs the amplified output to the crystal filter 5.

The crystal filter 5 outputs the oscillation frequency from Amp2 to Amp3 by passing through a specific frequency band.

Amp3 amplifies the output from the crystal filter 5 and outputs the amplified input to the output terminal (Out).

The conventional ultra-low noise crystal oscillator has an ultra-low noise characteristic by matching the oscillation frequency of the oscillation element 4 in the oscillation circuit section and the center frequency of the crystal filter 5 of the filter section of the subsequent stage.

In the oscillation circuit section, a Colpitts circuit is used.

[Colpitts Circuit: FIG. 4]

The Colpitts circuit used in the oscillation circuit section will be described with reference to FIG. 4. FIG. 4 is a schematic circuit diagram of a Colpitts circuit.

The Colpitts circuit corresponds to Amp1 and the oscillation element 4 of FIG. 3, and as shown in FIG. 4, includes the oscillation element 4 of the crystal unit, an NPN-type transistor (Q1) 10, a capacitor (C1) 11, and a capacitor (C2) 12.

Then, one end of the oscillation element 4 is connected to the base (B) of the transistor 10, and the other end is grounded.

Further, one end of the capacitor 11 is connected to the base of the transistor 10, and the other end of the capacitor 11 is connected to one end of the capacitor 12, and the other end of the capacitor 12 is grounded. That is, the capacitor 11 and the capacitor 12 are connected in series.

Then, the power supply voltage is applied to the collector (C) of the transistor 10. The emitter (E) of the transistor 10 is connected to a line connecting the other end of the capacitor 11 and one end of the capacitor 12.

[Related Art]

Incidentally, as the related prior art, there is Japanese Unexamined Patent Application Publication No. 2002-232236, "COMPOSITE TYPE CRYSTAL VIBRATOR AND CRYSTAL OSCILLATOR USING THE SAME".

Japanese Unexamined Patent Application Publication No. 2002-232236 discloses a composite type crystal unit having an oscillation element and a resonator excellent in economy by promoting miniaturization.

However, in the conventional ultra-low noise crystal oscillator, since employing a Colpitts circuit in the oscillation circuit section, there is a problem shown as below.

The ultra-low noise crystal oscillator had to match the oscillation frequency of the oscillation circuit section with the center frequency of the filter section, so long as the Colpitts circuit was adopted, the resonance frequencies of the two crystal oscillators of the oscillation element and the crystal filter had to be made different, and it was necessary to prepare two kinds of crystal oscillators, each of which was shifted in resonance frequency.

This becomes capacitive because the oscillator circuit section is mainly composed of a capacitor (i.e., a capacitor consisting of an oscillation element and capacitors C1 and C2) in the Colpitts circuit, and in order to satisfy the oscillation condition in the entire oscillation loop, the oscillation element of the oscillator circuit section is used in the inductive section. Then, the series resonance frequency of the oscillation element is designed to be the center frequency of the crystal filter; it is intended to match the oscillation frequency of the oscillation circuit section to its center frequency. Therefore, the resonance frequency of the oscillator frequency and the oscillation element of the oscillation circuit section is assumed to be different.

Therefore, in the conventional ultra-low noise crystal oscillator, the oscillation element of the oscillator circuit section and the crystal filter of the filter section must be prepared two types of crystal units having different resonance frequencies. Since the manufacturing process is complicated and two types of crystal units are separately manufactured, there is a problem that manufacturing variations of products occur.

Incidentally, Japanese Unexamined Patent Application Publication No. 2002-232236 does not disclose that a configuration of an ultra-low noise crystal oscillator using a Butler circuit in the oscillation circuit section.

The disclosure has been made in view of the above-described situation, and provides a crystal oscillator capable of simplifying a manufacturing process, reducing manufacturing costs, and reducing manufacturing variations of a product.

SUMMARY

According to an aspect of the disclosure, a crystal oscillator is provided and has: an oscillation circuit section, provided with a first crystal unit as an oscillation element; and a filter section, connected to an output side of the oscillation circuit section and provided with a second crystal unit as a crystal filter, in which the oscillation circuit section has a capacitor and an inductor.

BRIEF DESCRIPTION OF THE DRAWINGS

The foregoing and additional features and characteristics of this disclosure will become more apparent from the following detailed description considered with reference to the accompanying drawings, wherein.

DESCRIPTION OF EMBODIMENTS

The following describes an embodiment of the disclosure with reference to the drawings.

Outline of Embodiment

The crystal oscillator (the present oscillator) according to an embodiment of the disclosure is an ultra-low noise crystal oscillator using two crystal units; an oscillation element of an oscillation circuit section and a crystal filter of a filter section at a subsequent stage, and uses a Butler circuit having a capacitor and a inductance in the oscillation circuit section, which can simplify the manufacturing process, reduce manufacturing costs, and reduce manufacturing variations of products.

Figure 3:
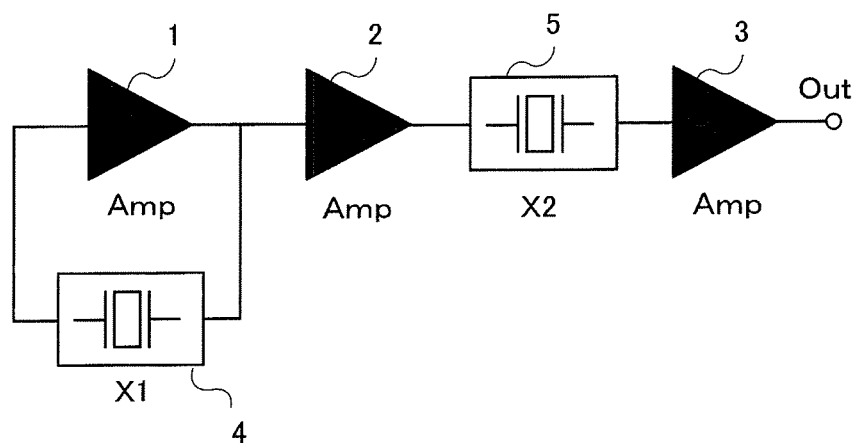
FIG. 3 is a simplified circuit diagram of an ultra-low noise crystal oscillator.
Figure 4:
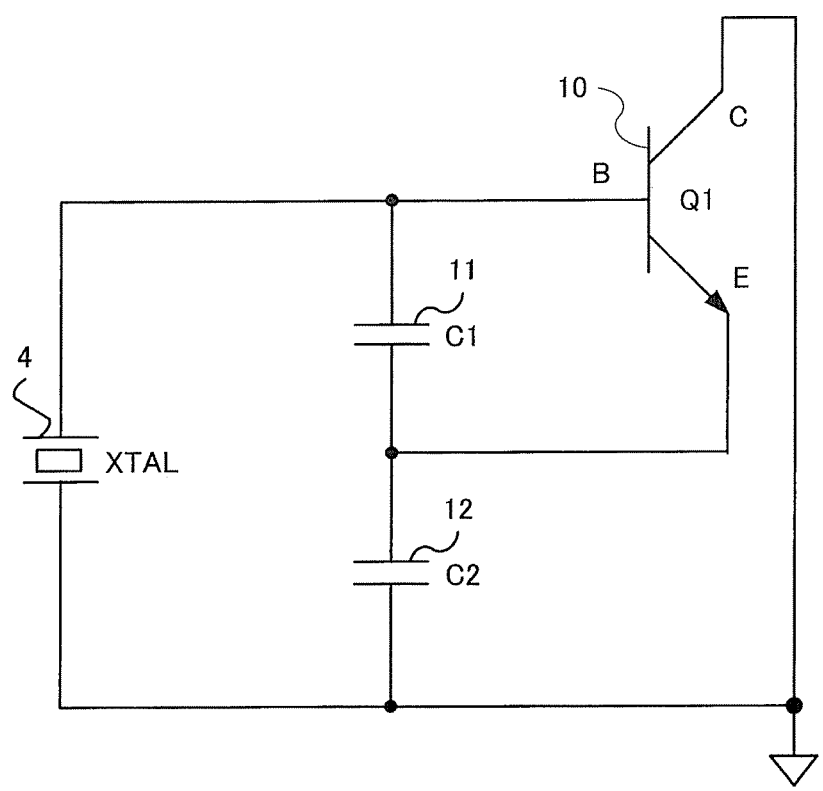
FIG. 4 is a schematic circuit diagram of a Colpitts circuit.

Incidentally, the basic configuration of the present oscillator is the same as that shown in FIG. 3, but the configuration of the oscillation circuit section is different from the conventional.

Figure 1:
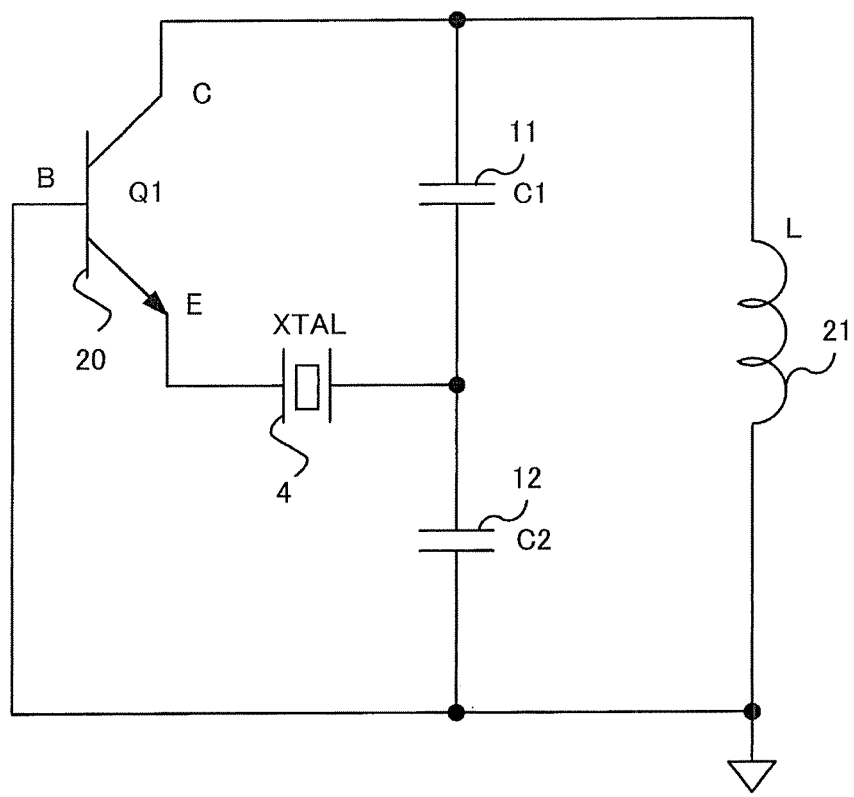
FIG. 1 is a schematic circuit diagram of a Butler circuit of the present oscillator.

[A Butler Circuit of the Present Oscillator: FIG. 1]

The Butler circuit of the present oscillator will be described with reference to FIG. 1. FIG. 1 is a schematic circuit diagram of a Butler circuit of the present oscillator.

The Butler circuit of the present oscillator includes an oscillation element 4 of a crystal unit, an NPN type transistor (Q1) 20, a capacitor (C1) 11, a capacitor (C2) 12, and an inductor 21, as shown in FIG. 1.

Then, in the Butler circuit, the base (B) of the transistor 20 is grounded, a power supply voltage is applied to the collector (C) of the transistor 20, one end of the capacitor 11 is connected to one end of the inductor 21, and the other end of the inductor 21 is grounded.

Further, one end of the capacitor 12 is connected to the other end of the capacitor 11, and the other end of the capacitor 12 is grounded.

One end of the oscillation element 4 is connected to the emitter (E) of the transistor 20 (E), and the other end of the oscillation element 4 is connected to a line connecting the capacitor 11 and the capacitor 12.

The Butler circuit basically consists of a capacitor (C1, C2) and an inductor (L), which oscillates at the series resonant frequency of the equivalent circuit of a crystal unit. Therefore, when a Butler circuit is adopted in the oscillation circuit section of the present oscillator, the two crystal units of the oscillation circuit section and the filter section can be used with the same resonance frequency. More precisely, it can be used if the difference in the resonance frequency of the crystal units is less than or equal to the half bandwidth (i.e., the value obtained by dividing the resonance frequency of the crystal unit by the Q value).

Since the Butler circuit is adopted in the oscillation circuit section in the present oscillator; the center frequency can be adjusted by the inductor even if the oscillation frequency of the oscillation element in the oscillation circuit section and the resonance frequency of the crystal filter in the filter section are the same. That is, it is possible to adjust the oscillation frequency of the oscillation circuit section with an inductor so as to match the resonance frequency of the filter section.

Therefore, it is possible to use two crystal units of the same load capacitance in the oscillation circuit section and the filter section.

Figure 2:
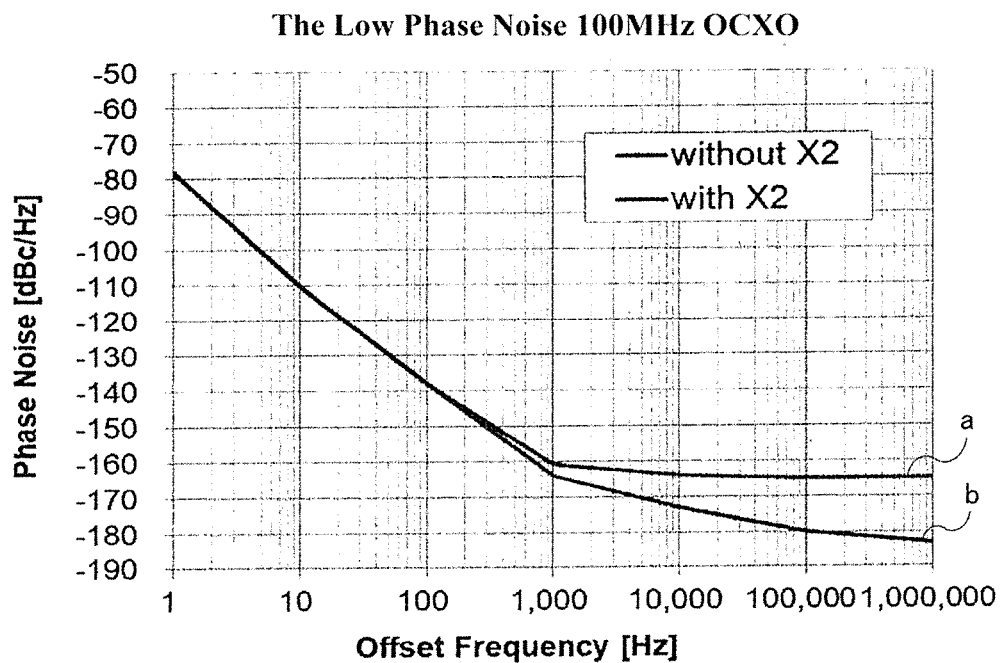
FIG. 2 is a diagram illustrating the low phase noise properties of the present oscillator and the conventional oscillator.

[Low Noise Characteristics: FIG. 2]

The low-noise characteristics of the present oscillator will be described with reference to FIG. 2. FIG. 2 is a diagram illustrating the low phase noise properties of the present oscillator and the conventional oscillator. In FIG. 2, the vertical axis is phase noise (dBc/Hz) for each frequency and the horizontal axis is frequency offset (Hz). In FIG. 2, the upper graph is the characteristic of the conventional oscillator (a), and the lower graph is the characteristic of the present oscillator (b).

Incidentally, here, the conventional oscillator is a configuration that does not provide a filter section of the crystal filter (X2). Of course, the present oscillator is provided with a filter section.

Characteristics of the low phase noise shown in FIG. 2 show the case of using a crystal oscillator (i.e., OCXO: Oven Controlled Crystal Oscillator) with a constant temperature bath in the frequency range up to 100 MHz.

In the characteristics of the conventional oscillator (a [without X2]), no reduction of phase noise is observed at frequency offset above 1000 Hz, but in the characteristics of the present oscillator (b [with X2]), reduction of phase noise is achieved even at frequency offset above 1,000 Hz.

Effects of Embodiments

According to the present oscillator, by employing a Butler circuit in the oscillation circuit section, it is not necessary to prepare two types of crystal units having different resonance frequencies, the manufacturing cost is reduced by simplifying the manufacturing process, two crystal units can be manufactured in the same lot, there is an effect that it is possible to reduce the manufacturing variation of the product.

Further, according to the present oscillator, the butler circuit as compared with the Colpitts circuit is good floor noise characteristics; there is an effect that can improve the low noise characteristics.

The disclosure is suitable for a crystal oscillator capable of simplifying a manufacturing process, reducing manufacturing costs, and reducing manufacturing variations of a product.

According to the disclosure, in the above crystal oscillator, the difference between the resonance frequencies of the first crystal unit and the second crystal unit is equal to or less than the half bandwidth.

According to the disclosure, in the above crystal oscillator, the oscillation circuit section is a Butler circuit.

According to the disclosure, in the above crystal oscillator, the Butler circuit has: a first capacitor and a second capacitor connected in series; an inductor connected in parallel to the first and second capacitors in series connection; a base of a transistor being grounded; a collector of the transistor, connected to one end of the first capacitor and the inductor; and an emitter of the transistor, connected to a line connecting the first capacitor and the second capacitor through the first crystal unit.

Effect of the Disclosure

According to the disclosure, a crystal oscillator has: an oscillator circuit section, provided with a first crystal unit as an oscillation element; and a filter section, connected to an output side of the oscillator circuit section and provided with a second crystal unit as a crystal filter. And, the oscillator circuit section has a capacitor and an inductor. This has the effect of simplifying the manufacturing process, reducing the manufacturing cost, and reducing the manufacturing variation of the product.

What is claimed is:
1. A crystal oscillator, comprising;
  an oscillator circuit section, having a first crystal unit as an oscillation element; and
  a filter section, connected to an output side of the oscillator circuit section, having a second crystal unit as a crystal filter,
  wherein the oscillation circuit section includes a capacitor and an inductor;
  wherein the oscillation circuit section is a Butler circuit;
  the Butler circuit includes:
    a first capacitor and a second capacitor connected in series;
    an inductor connected in parallel to the first and second capacitors in series connection;
    a base of a transistor, being grounded;
    a collector of the transistor, connected to one end of the first capacitor and the inductor; and
    an emitter of the transistor, connected to a line connecting the first capacitor and the second capacitor via the first crystal unit.
2. The crystal oscillator according to claim 1, wherein a difference in resonance frequencies of the first crystal unit and the second crystal unit is equal to or less than a half bandwidth.

\* \* \* \* \*